US010010005B2

(12) United States Patent
Hyun et al.

(10) Patent No.: US 10,010,005 B2
(45) Date of Patent: Jun. 26, 2018

(54) ELECTRONIC DEVICE HAVING WATERPROOF STRUCTURE

(71) Applicant: Samsung Electronics Co., Ltd, Gyeonggi-do (KR)

(72) Inventors: Jung-Woong Hyun, Gyeongsangbuk-do (KR); Sung-Young Lee, Gyeongsangbuk-do (KR); Yunjae Jun, Gyeongsangbuk-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/344,485

(22) Filed: Nov. 4, 2016

(65) Prior Publication Data

US 2017/0135239 A1    May 11, 2017

(30) Foreign Application Priority Data

Nov. 6, 2015 (KR) ........................ 10-2015-0155549

(51) Int. Cl.
*H05K 1/00* (2006.01)
*H05K 5/06* (2006.01)
(Continued)

(52) U.S. Cl.
CPC ............... *H05K 5/06* (2013.01); *H05K 1/115* (2013.01); *H05K 1/14* (2013.01); *H05K 5/0017* (2013.01);
(Continued)

(58) Field of Classification Search
USPC ............. 361/749, 748, 750, 679.01; 174/250
See application file for complete search history.

(56) References Cited

U.S. PATENT DOCUMENTS

2007/0034493 A1    2/2007  Kawasaki et al.
2011/0096213 A1*   4/2011  Hasegawa .......... G02B 13/0035
                                                    348/294
(Continued)

FOREIGN PATENT DOCUMENTS

JP    2012-199867    10/2012
JP    2013-054965     3/2013
(Continued)

OTHER PUBLICATIONS

Foreign Communication From a Related Counterpart Application, PCT Application No. PCT/KR2016/012511, International Search Report dated Feb. 20, 2017, 3 pages.
(Continued)

*Primary Examiner* — Andargie M Aychillhum

(57) ABSTRACT

An electronic device including a front cover, a back cover, and a sidewall configured to surround at least a part of an internal space formed between the front and back covers. Disposed in the space is a rear case including a first conductive connecting member formed therein; a first space formed between the back cover and the rear case; and a second space formed between the front cover and the rear case, the second space configured to be hermetically sealed from the first space. An electrical connecting member includes a first part disposed in the first space, a second part that extends to a surface of a non-conductive structure, and a third part electrically contacting the first conductive connecting member. A printed circuit board disposed within the second space is electrically connected with the first conductive connecting member. The sidewall may comprise an opening configured to receive a side key.

20 Claims, 18 Drawing Sheets

(51) Int. Cl.
  *H05K 1/11*   (2006.01)
  *H05K 1/14*   (2006.01)
  *H05K 5/00*   (2006.01)
  *H05K 5/03*   (2006.01)

(52) U.S. Cl.
  CPC ..... *H05K 5/03* (2013.01); *H05K 2201/09563* (2013.01)

(56) References Cited

U.S. PATENT DOCUMENTS

| | | |
|---|---|---|
| 2012/0276768 A1 | 11/2012 | Schmidt et al. |
| 2013/0341597 A1* | 12/2013 | Kim .................. H01L 27/3225 257/40 |
| 2014/0124343 A1 | 5/2014 | Lee et al. |
| 2015/0103478 A1 | 4/2015 | Lee et al. |
| 2015/0155614 A1 | 6/2015 | Youn et al. |
| 2015/0296622 A1* | 10/2015 | Jiang et al. ........... G01L 1/2268 361/750 |
| 2017/0064811 A1* | 3/2017 | Li ......................... H01G 4/224 |

FOREIGN PATENT DOCUMENTS

| | | |
|---|---|---|
| KR | 10-1107015 B1 | 1/2012 |
| KR | 10-2013-0065981 | 6/2013 |
| KR | 20150109909 A | 10/2015 |

OTHER PUBLICATIONS

Foreign Communication From a Related Counterpart Application, PCT Application No. PCT/KR2016/012511, Written Opinion dated Feb. 20, 2017, 5 pages.

* cited by examiner

US 10,010,005 B2

ELECTRONIC DEVICE HAVING WATERPROOF STRUCTURE

CROSS-REFERENCE TO RELATED APPLICATION(S) AND CLAIM OF PRIORITY

The present application is related to and claims the priority under 35 U.S.C. § 119(a) to Korean Application Serial No. 10-2015-0155549, which was filed in the Korean Intellectual Property Office on Nov. 6, 2015, the entire content of which is hereby incorporated by reference.

TECHNICAL FIELD

Various embodiments of the present disclosure relate to a waterproof structure for an electronic device.

BACKGROUND

General electronic devices have external appearances that may be affected by the materials or the arrangement of components therein. A plurality of members relating to the external appearances may be included as parts of the external appearances of the electronic devices. For example, a display, a receiver, a front camera, and the like may be arranged on the front exterior of an electronic device, and a rear camera, a flash, a speaker hole, and the like may be arranged on the rear exterior of the electronic device. Furthermore, a side key, a USB connector, an earphone jack connector, a microphone hole, and the like may be arranged on side surfaces of the electronic device. The arrangement of the components may vary according to the exterior designs of electronic products.

Components relating to the external appearance of an electronic device, which are disposed in the electronic device, may include exterior members. In particular, among the exterior members, a movable exterior member that undergoes a physical press or an exterior member with an insertion hole may have low waterproofing performance. For example, a volume control key or a power key, which is disposed on a side surface of the electronic device, may move while the top of the key is exposed to the outside. Foreign substances (such as moisture) may infiltrate into the electronic device through a gap between a moving member and a case frame to damage a printed circuit board, etc.

SUMMARY

To address the above-discussed deficiencies, it is a primary object to provide an electronic device with a waterproof structure that may achieve excellent assembly efficiency, facilitate the mounting and arrangement of components to implement various designs, and make better use of a component mounting space.

A portable electronic device, according to various embodiments of the present disclosure, may include: a front cover configured to form the front of the electronic device; a back cover configured to form the back of the electronic device; a sidewall configured to surround at least a part of the space formed between the front cover and the back cover; a display device located in the space and including a screen area exposed through the front cover; a structure located within the space and extending from the sidewall, the structure including a first surface directed toward the front cover, a second surface directed toward the back cover, and a through-hole extending from a part of the first surface to a part of the second surface; a non-conductive structure with which the through-hole of the structure is filled, the non-conductive structure including a first surface directed toward the front cover, a second surface directed toward the back cover, and a via-hole; a first conductive connecting member with which the via-hole of the non-conductive structure is filled, the first conductive connecting member including a first surface directed toward the front cover and a second surface directed toward the back cover; a first space communicating with at least one opening formed in the sidewall, at least a part of the first space being surrounded by a part of the sidewall and/or a part of the structure; a second conductive connecting member disposed such that a part thereof is located within the first space, another part thereof extends to the second surface of the non-conductive structure, and yet another part thereof makes electrical contact with the first conductive connecting member; a second space at least partially surrounded by another part of the structure and the non-conductive structure so as to be hermetically sealed from the first space; and a printed circuit board disposed within the second space and electrically connected with the first conductive connecting member.

An electronic device, according to various embodiments of the present disclosure, may include: a front cover; a back cover; a rear case disposed between the front cover and the back cover; a first space between the back cover and the rear case; a second space between the front cover and the rear case, the second space being hermetically sealed from the first space; a first conductive connecting member formed in the rear case, the first conductive connecting member including a first surface directed toward the front cover and a second surface directed toward the back cover; an electrical connecting member disposed such that a part thereof is located within the first space, another part thereof extends to a second surface of a non-conductive structure, and yet another part thereof makes electrical contact with the first conductive connecting member; and a printed circuit board disposed within the second space and electrically connected with the first conductive connecting member.

Various embodiments of the present disclosure provide a waterproof structure that provides a conductive structure without forming a hole in a rear case.

Various embodiments of the present disclosure may implement a waterproofing function with a primary waterproof structure reducing a need for a secondary additional structure, thereby making better use of space.

Various embodiments of the present disclosure may achieve excellent assembly efficiency and may facilitate the mounting and arrangement of components to implement various designs.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
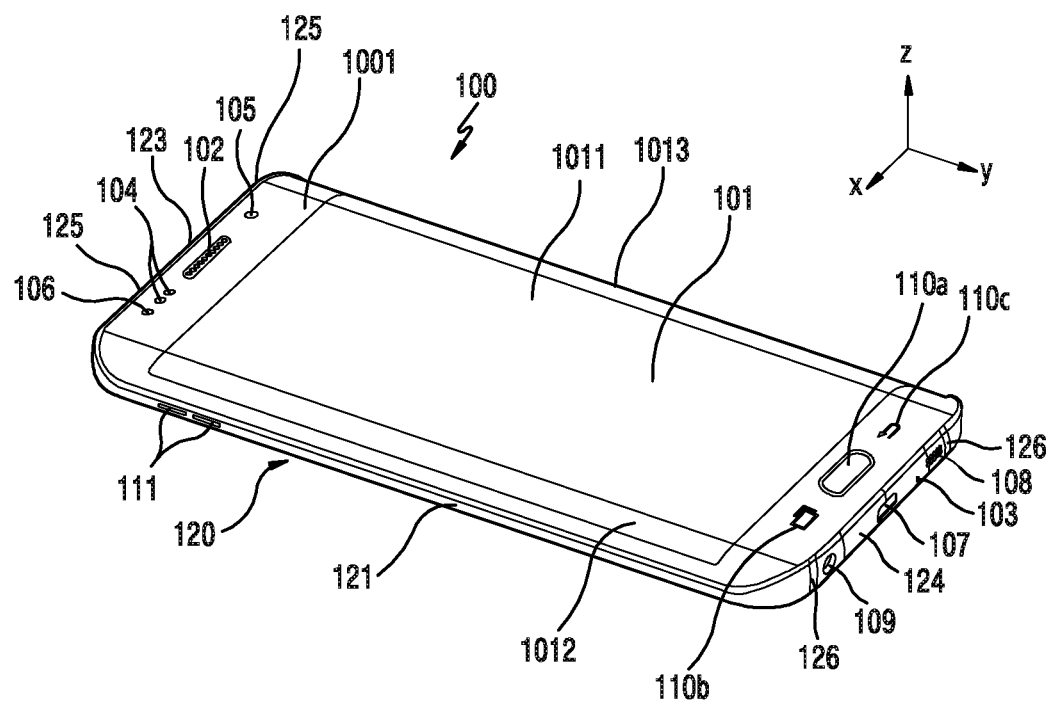
FIG. 1A illustrates a front perspective view of an electronic device according to various embodiments of the present disclosure.

FIGS. 1A through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expressions such as "first", "second", or the like used in various embodiments of the present disclosure may modify various elements regardless of order or importance, and do not limit corresponding elements. The above-described expressions may be used to distinguish an element from another element. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The expression "configured to" may not necessarily mean "specially designed to" in terms of hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well unless the context clearly indicates otherwise. Unless defined otherwise, all terms used herein, including technical terms and scientific terms, may have the same meaning as commonly understood by a person of ordinary skill in the art to which the present disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the present disclosure should not be interpreted to exclude embodiments of the present disclosure.

Hereinafter, various embodiments of the present disclosure will be described with reference to the accompanying drawings.

Figure 1B:
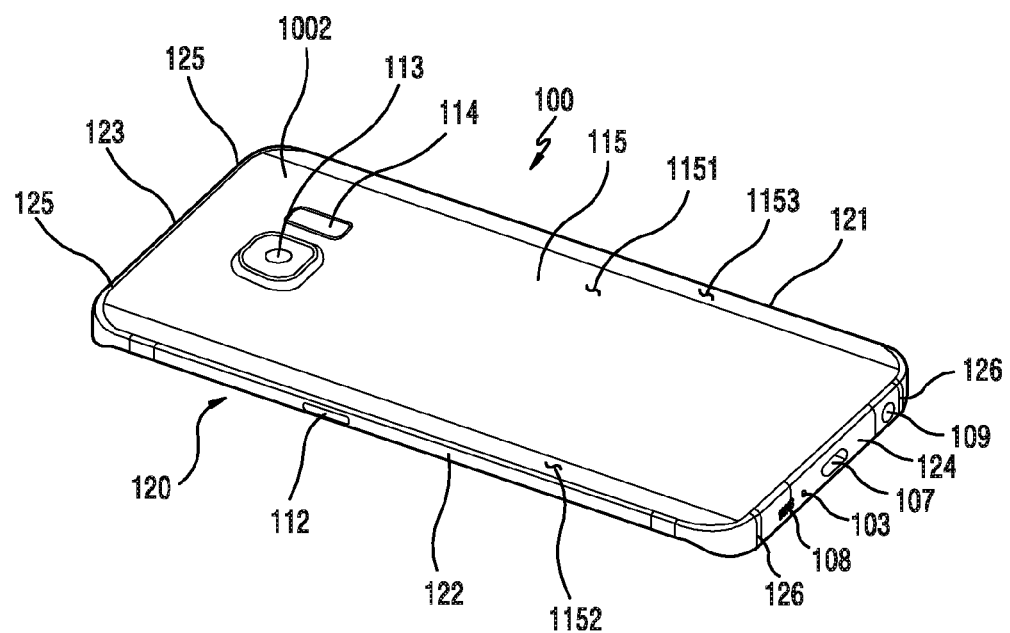
FIG. 1B illustrates a rear perspective view of an electronic device according to the various embodiments of the present disclosure.
Figure 1C:
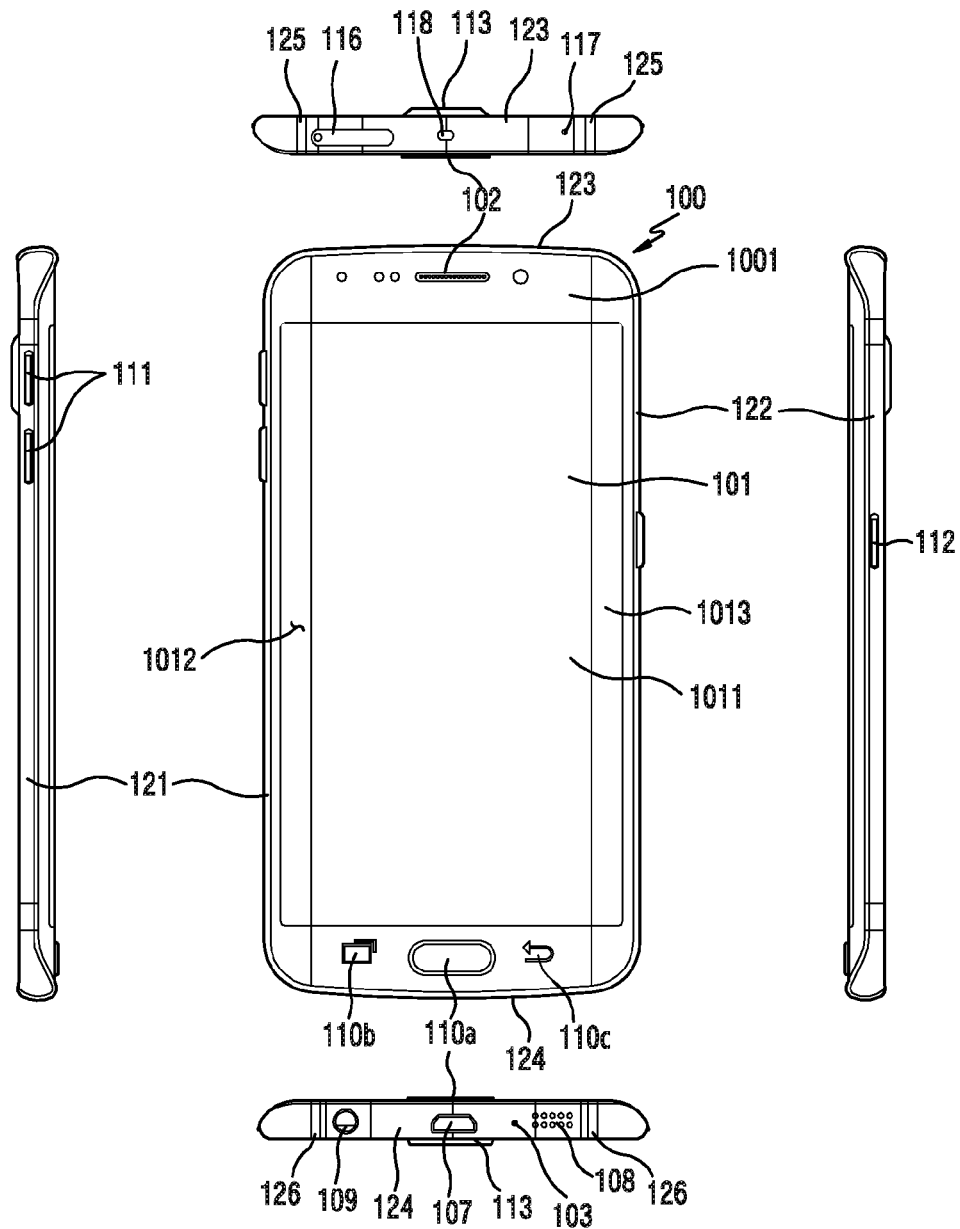
FIG. 1C illustrates an electronic device when viewed in various directions, according to various embodiments of the present disclosure.

FIG. 1A illustrates a front perspective view of an electronic device according to various embodiments of the present disclosure. FIG. 1B illustrates a rear perspective view of an electronic device according to the various embodiments of the present disclosure. FIG. 1C illustrates an electronic device when viewed in various directions, according to various embodiments of the present disclosure.

Referring to FIGS. 1A to 1C, the electronic device 100, according to the various embodiments, may have a display 101 (or referred to as a touch screen with a touch panel mounted therein) mounted on the front thereof. A receiver 102 may be disposed on the upper side of the display 101 to receive a counterpart's speech. A microphone 103 may be disposed on the lower side of the display 101 to transmit an electronic device user's speech to a counterpart.

Components for performing various functions of the electronic device 101 may be disposed around the receiver 102. The components may include at least one sensor module 104. The sensor module 104 may include, for example, at least one of an illuminance sensor (e.g., an optical sensor), a proximity sensor (e.g., an optical sensor), an infrared sensor, and an ultrasonic sensor. According to an embodiment, the components may include a front camera 105. According to an embodiment, the components may also include an indicator 106 for informing a user of state information of the electronic device 100.

The display 101 may be formed to be large in size in order to cover almost the entire front of the electronic device 100. The main home screen is the first screen that is displayed on the display 101 when the electronic device 100 is turned on. Furthermore, when the electronic device 100 has multiple pages of different home screens, the main home screen may be the first of the multiple pages of home screens. Short-cut icons for executing frequently used applications, a main menu switching key, time, weather, and the like may be displayed on the home screen. The main menu switching key is used to display a menu screen on the display 101. Furthermore, a status bar may be formed on the upper end of the display 101 to indicate the states of the electronic device 100 (such as a battery charging state, the strength of a received signal, and the current time). A home key 110a, a menu key 110b, and a back key 110c may be formed on the lower side of the display 101.

The home key 110a is used to display the main home screen on the display 101. For example, the main home screen may be displayed on the display 101 when the home key 110a is touched while a different home screen from the main home screen or the menu screen is displayed on the display 101. Furthermore, the main home screen may be displayed on the display 101 when the home key 110a is touched while applications are being executed on the display 101. In addition, the home key 110a may also be used to display recently used applications or a task manager on the display 101.

The menu key 110b is used to provide a connectivity menu that may be used on the display 101. The connectivity menu may include a widget addition menu, a background image switching menu, a search menu, an editing menu, an environment setting menu, and the like. The back key 110c may be used to display the screen executed just before the currently executed screen, or to end the most recently used application.

The electronic device 100, according to the various embodiments, may include a metal frame 120 as a metal housing. The metal frame 120 may be disposed along the outer periphery of the electronic device 100 and may extend to at least one area of the back of the electronic device 100, which is connected to the outer periphery of the electronic device. The metal frame 120 may define at least a part of the thickness of the electronic device 100 along the outer periphery of the electronic device 100, and may be formed in a closed loop shape. Without being limited thereto, however, the metal frame 120 may be formed such that it contributes to at least a part of the thickness of the electronic device 100.

The metal frame 120 may be disposed in at least one area of the outer periphery of the electronic device 100. In an embodiment where the metal frame 120 serves as a part of the housing of the electronic device 100, the rest of the housing may be replaced with a non-metal member. For example, the housing may be formed in such a manner that the non-metal member is insert-molded into the metal frame 120. The metal frame 120 may include one or more cut-off portions 125 and 126, and unit metal frames separated by the cut-off portions 125 and 126 may be used as antenna coils. An upper frame 123 may serve as a unit frame by means of a pair of cut-off portions 125 that are formed with a predetermined interval therebetween. A lower frame 124 may serve as a unit frame by means of a pair of cut-off portions 126 that are formed with a predetermined interval therebetween. The cut-off portions 125 and 126 may be formed together when the non-metal member is insert-molded into the metal member.

The metal frame 120 may have a closed loop shape along the outer periphery of the electronic device, and may be disposed in such a manner that the metal frame 120 contributes to the whole thickness of the electronic device 100. The metal frame 120 may include a left frame 121, a right frame 122, the upper frame 123, and the lower frame 124 when the electronic device 100 is viewed from the front.

Various electronic components may be disposed in the lower frame 124 of the electronic device. A speaker 108 may be disposed on one side of the microphone 103. An interface connector 107 may be disposed on the opposite side of the microphone 103 to perform data transmission/reception with an external device and to receive external power in order to charge the electronic device 100. An ear-jack hole 109 may be disposed on one side of the interface connector 107. The microphone 103, the speaker 108, the interface connector 107, and the ear-jack hole 109, which have been described above, may all be disposed within the area of the unit frame that is formed by the pair of cut-off portions 126 disposed in the lower frame 124. Without being limited thereto, however, at least one of the aforementioned electronic components may be disposed in an area that includes the cut-off portion 126, or may be disposed outside the unit frame.

Various electronic components may also be disposed in the upper frame 123 of the electronic device 100. A socket device 116, into which a card-type external device is inserted, may be disposed in the upper frame 123. The socket device 116 may receive at least one of a unique ID card (e.g., a SIM card, a UIM card, etc.) for the electronic device and a memory card for increasing a storage space. An infrared sensor module 118 may be disposed on one side of the socket device 116, and an auxiliary microphone device 117 may be disposed on one side of the infrared sensor module 118. The socket device 116, the infrared sensor module 118, and the auxiliary microphone device 117 may all be disposed within the area of the unit frame that is formed by the pair of cut-off portions 125 disposed in the upper frame 123. Without being limited thereto, however, at least one of the aforementioned electronic components may be disposed within an area that includes the cut-off portion 125, or may be disposed outside the cut-off portions.

One or more first side key buttons 111 may be disposed in the left frame 121 of the metal frame 120. A pair of first side key buttons 111 may partially protrude from the left frame 121 to contribute to performing a volume up/down function, a scroll function, and the like. At least one second side key button 112 may be disposed in the right frame 122 of the metal frame 120. The second side key button 112 may contribute to performing a power on/off function, a wake-up/sleep function of the electronic device, and the like. At least one key button 110 may be disposed in at least one area on the lower side of the display 101 on the front 1001 of the electronic device 100. The key button 110 may perform a home key button function. A finger scan sensor device may be disposed on the top of the home key button. The home key button may contribute to performing a first function (a home screen return function, a wake-up/sleep function, etc.) by means of an operation of physically pressing the home key button, and may contribute to performing a second function (e.g., a finger scan function) by means of an operation of swiping the top of the home key button. Although not illustrated, touch pads may be disposed on the left and right sides of the key button 110 to perform a touch function.

A rear camera 113 may be disposed on the back 1002 of the electronic device 100, and at least one electronic component 114 may be disposed on one side of the rear camera 113. The electronic component 114 may include at least one of an illuminance sensor (e.g., an optical sensor), a proximity sensor (e.g., an optical sensor), an infrared sensor, an ultrasonic sensor, a heart-rate sensor, and a flash device.

The front 1001 of the electronic device 100, on which the display 101 is mounted, may include a flat surface portion 1011 and left and right curved surface portions 1012 and 1013 that are formed on the left and right sides of the flat surface portion 1011. The front 1001 of the electronic device 100 may include both the display area 101 and the remaining area (e.g., BM area) using a single window. The left and right curved surface portions 1012 and 1013 may extend from the flat surface portion 1011 in the X-axis direction of the electronic device 100. The left and right curved surface portions 1012 and 1013 may serve as parts of the lateral side surfaces of the electronic device 100. In this case, the left and right curved surface portions 1012 and 1013, together with the left and right frames 121 and 122 of the metal frame 120, may serve as the lateral side surfaces of the electronic device 100. Without being limited thereto, however, the front 1001 of the electronic device 100, on which the display 101 is mounted, may include at least one of the left and right curved surface portions 1012 and 1013. The front 1001 of the electronic device 100 may also be configured to include primarily the left curved surface portion 1012 along the flat surface portion 1011, or to include primarily the right curved surface portion 1013 along the flat surface portion 1011.

The front 1001 of the electronic device 100 may include: a window 130 (illustrated in FIG. 3) that includes the curved surface portions 1012 and 1013 on the left and right sides thereof; and a flexible display module applied to at least one area on the lower side of the window. The area that includes the flexible display module may serve as the display 101. According to an embodiment, the window 130 (illustrated in FIG. 3) may be formed in such a manner (hereinafter, referred to as the '3D type') that the top and bottom thereof are simultaneously bent. Without being limited thereto, however, the window 130 (illustrated in FIG. 3) may also be formed in such a manner (hereinafter, referred to as the '2.5D type') that the left and right portions of the top thereof are formed in a curved shape and the back thereof is formed in a flat shape. The window may be formed of a transparent glass (e.g., sapphire glass) or a transparent synthetic resin.

The electronic device 100 may control the display module to selectively display information. The electronic device 100 may control the display module to configure a screen primarily on the flat surface portion 1011. The electronic device 100 may control the display module to configure a screen on the flat surface portion 1011 and one of the left and right curved surface portions 1012 and 1013. The electronic device 100 may control the display module to configure a screen primarily on at least one of the left and right curved surface portions 1012 and 1013, except the flat surface portion 1011.

The back 1002 of the electronic device 100 may also be formed by a single rear external surface mounting member 115 as a whole. When viewed from the back so that the electronic device 100 is face down (for example, as in FIG. 1B), the back 1002 of the electronic device 100 may include: a flat surface portion 1151 that is formed around the center thereof as a whole; and left and right curved surface portions 1152 and 1153 that are formed on the left and right sides of the flat surface portion 1151. The window 115 may be configured in a 2.5D type such that the left and right curved surface portions 1152 and 1153 of the outer surface thereof are formed in a curved shape and the back thereof is formed in a flat shape. Without being limited thereto, however, the window 115 may also be formed in a 3D type similar to the window disposed on the front 1001 of the electronic device 100. The left and right curved surface portions 1152 and 1153 may serve as parts of the lateral side surfaces of the electronic device 100. In this case, the left and right curved surface portions 1152 and 1153, together with the left and right frames 121 and 122 of the metal frame 120, may serve as the lateral side surfaces of the electronic device 100. Without being limited thereto, however, the back 1001 of the electronic device 100 may include primarily at least one of the left and right curved surface portions 1152 and 1153. The back 1002 of the electronic device 100 may also be configured to include primarily the left curved surface portion 1152 along the flat surface portion 1151, or to include primarily the right curved surface portion 1153 along the flat surface portion 1151.

The upper left and right corner portions and the lower left and right corner portions of the front 1001 of the electronic device 100 may be formed such that they are simultaneously inclined in the X-axis, Y-axis, and Z-axis directions while the window is being bent. By virtue of this shape, the upper left and right corner portions and the lower left and right corner portions of the metal frame 120 may be formed such that the heights of the side surfaces thereof gradually decrease.

Figure 2:
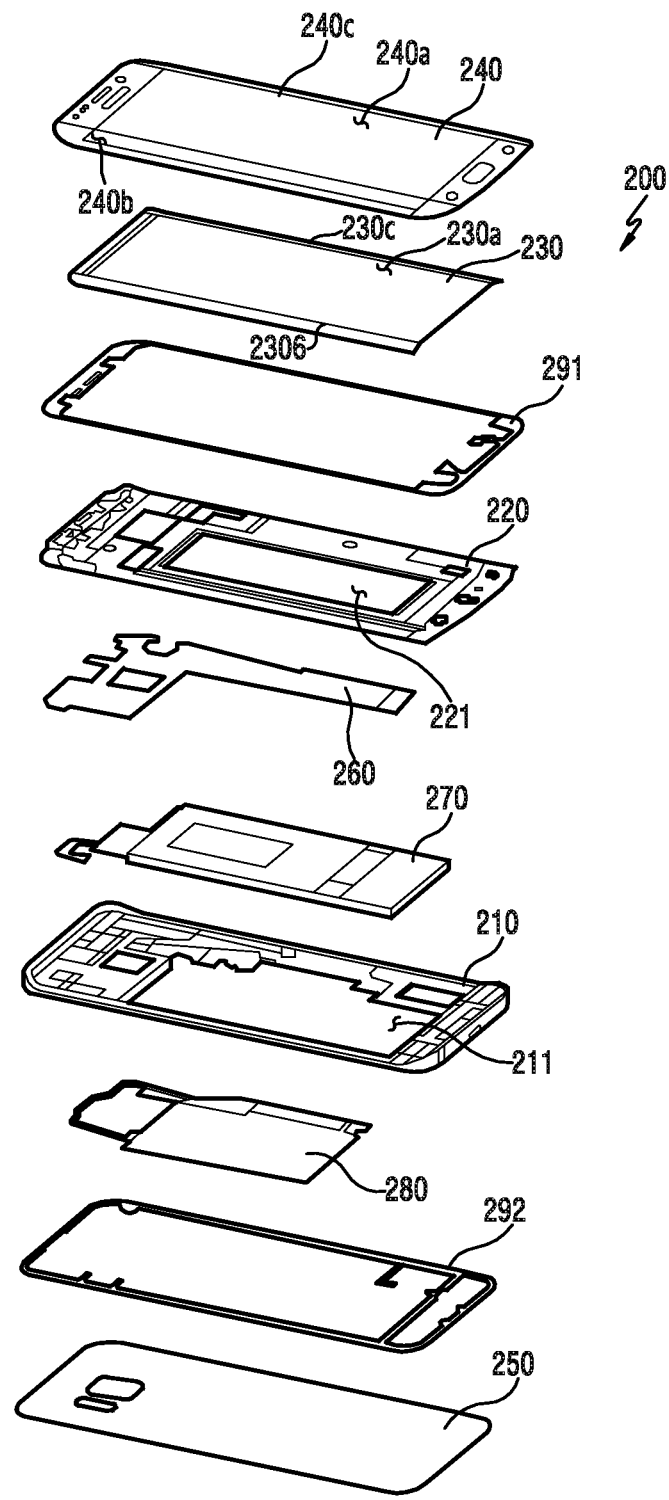
FIG. 2 is an exploded perspective view illustrating the configuration of an electronic device according to various embodiments of the present disclosure.

FIG. 2 is an exploded perspective view illustrating an electronic device according to various embodiments of the present disclosure. Hereinafter, the electronic device 200 in the drawing may be the same electronic device as the above-described electronic device 100.

Referring to FIG. 2, the electronic device 200 may be configured such that a PCB 260, a bracket 220, a display module 230, and a front window 240 are sequentially stacked on the top of the housing 210 thereof. According to an embodiment, a wireless power transmitting/receiving member 280 and a rear window 250 may be sequentially stacked on the back of the housing 210. According to an embodiment, a battery pack 270 may be accommodated in a battery pack receiving space 211 formed in the housing 210 and may be disposed so as to not overlap the PCB 260. According to an embodiment, the battery pack 270 and the PCB 260 may be disposed in parallel so as to not overlap each other. According to an embodiment, the display module 230 may be secured to the bracket 220, and the front window 240 may be secured in such a manner that it is attached to the bracket 220 by a first adhesive member 291. According to an embodiment, the rear window 250 may be secured in such a manner that it is attached to the housing 210 by a second adhesive member 292.

According to various embodiments, the front window 240 may include: a flat surface portion 240a; and left and right bent portions 240b and 240c that are bent with respect to the flat surface portion 240a in opposite directions. According to an embodiment, the front window 240 may be located on the top of the electronic device 200 to form the front of the electronic device 200, and may be formed of a transparent material to display a screen presented by the display module 230 and to provide an input/output window for various sensors. According to an embodiment, while a shape in which the left and right bent portions 240b and 240c are formed in a 3D type is illustrated, a shape may be applied in which the upper and lower portions, as well as the left and right portions, are single-bent, or a shape in which the upper, lower, left, and right portions are dual-bent. According to an embodiment, a touch panel may be further disposed on the rear surface of the front window 240 and may receive a touch input signal from the outside.

According to various embodiments, the display module 230 may also be formed in a shape corresponding to that of the front window 240 (a shape having a curvature corresponding to that of the front window 240). According to an embodiment, the display module 230 may include left and right bent portions 230b and 230c on the left and right sides of a flat surface portion 230a. According to an embodiment, a flexible display (UB) module may be used as the display module 230. According to an embodiment, where the front window 240 has the back in the shape of a window of a planar type (hereinafter, 2D type or 2.5D type), a general Liquid Crystal Display (LCD) or an On-Cell Tsp AMOLED (OCTA) may be applied since the back of the front window 240 is planar.

According to various embodiments, the first adhesive member 291 is a component for securing the front window 240 to the bracket 220 that is disposed within the electronic device, and may be a kind of tape, such as a double-sided tape, or a liquid adhesive layer, such as a bond. According to an embodiment, when a double-sided tape is applied as the first adhesive member 291, a general Polyethylene Terephthalate (PET) or a functional base may be applied as the internal base of the adhesive member 391. For example, by using a base formed of a foam tape or shock-resistive fabric material so as to reinforce the shock resistance, it is possible to prevent the front window from being damaged by external impact.

According to various embodiments, the bracket 220 may be disposed within the electronic device 200 so as to be used as a component for increasing the rigidity of the whole electronic device. According to an embodiment, the bracket 220 may be formed of at least one metal selected from Al, Mg, and special treatment steel (STS). According to an embodiment, the bracket 220 may be formed of a highly rigid plastic containing glass fibers, or may be formed of a combination of a metal and a plastic. According to an embodiment, in a case where a metal member and a non-metal member are used together, the bracket 220 may be formed by insert-molding the non-metal member into the metal member. According to an embodiment, the bracket 220 is located on the back of the display module 230. The bracket 320 may have a shape (curvature) that is similar to the shape of the back of the display module 330 and may support the display module 230. According to an embodiment, a resilient member (such as a sponge or a rubber), an adhesive layer (such as a double-sided tape), or a kind of sheet (such as a single-sided tape) may be additionally disposed between the bracket 220 and the display module 230 so as to protect the display module 230. According to an embodiment, a section of the bracket 220 may further include a spot-facing and hole area 221 for ensuring a component mounting space or a marginal space in consideration of a change of a component during use, such as the swelling of the battery pack 270. According to an embodiment, as needed, a sheet-type metal or composite material may be added to the corresponding hole area 221 so as to reinforce the internal rigidity, or an auxiliary device for improving a thermal characteristic, an antenna characteristic, or the like may be further provided in the hole area 221. According to an embodiment, the bracket 220 may be fastened to the housing (e.g., the rear case) 210 so as to form a space therein, and at least one electronic component may be disposed in the space. The electronic component may include a Printed Circuit Board (PCB) 260. Without being limited thereto, however, the electronic component may include an antenna device, a sound device, a power supply device, a sensor device, or the like in addition to the PCB 260.

According to various embodiments, the battery pack 270 may supply power to the electronic device 200. According to an embodiment, one surface of the battery pack 270 may be adjacent to the display module 230, and the opposite surface thereof may be adjacent to the rear window 250, which may cause the deformation and damage of counterpart objects when the battery pack 270 expands while being recharged. In order to prevent this, a space (swelling gap) may be provided between the battery pack 270 and the counterpart objects (e.g., the display module 230 and the rear window 250) so as to protect the counterpart objects. According to an embodiment, the battery pack 270 may be disposed in a form of being integrated with the electronic device 200. Without being limited thereto, however, the battery pack 270 may be implemented to be detachable when the rear window 250 is implemented to be detachable in the electronic device 200.

According to various embodiments, the housing 210 may form the exterior (e.g., the lateral side that includes a metal bezel) of the electronic device 200 and may be coupled with the bracket 220 to form an internal space. According to an embodiment, the front window 240 may be disposed on the front of the housing 210, and the rear window 250 may be disposed on the back of the housing 210. Without being limited thereto, however, the back of the housing 210 may be implemented with various materials, such as a synthetic resin, a metal, a composite material of a metal and a synthetic resin, etc. According to an embodiment, the gap between the internal structures, which is formed by the housing 210 and the rear window 250, may prevent the rear window 250 from being damaged by a secondary impact of the internal structures when an external shock (such as a fall of the electronic device) occurs.

According to various embodiments, the wireless power transmitting/receiving member 280 may be disposed on the back of the housing 210. According to an embodiment, the wireless power transmitting/receiving member 280 mainly has a thin film shape and is attached to one surface of an internally mounted component or one area of the inner surface of the housing 210; in particular, to an area that is adjacent to the rear window 250. The wireless power transmitting/receiving member 280 includes a structure that forms a contact point with the PCB 260 within the housing 210. According to an embodiment, the wireless power transmitting/receiving member 280 may be embedded or attached as a component of the battery pack 270 or the like, or a part of the housing 210, and may be provided in the form of being attached to both of the component and the housing 210.

According to various embodiments, the second adhesive member 292 is a component for securing the rear window 250 to the housing 210, and may be applied in a shape similar to that of the above-described first adhesive member 291.

According to various embodiments, the rear window 250 may be applied in a shape similar to that of the above-described front window 240. According to an embodiment, the front (the side exposed to the outside) of the rear window 250 may be formed to have a gradually increasing curvature toward the opposite left and right ends thereof. According to an embodiment, the back of the rear window 250 may be formed in a flat surface so as to be attached to the housing 210 by the second adhesive member 292.

Figure 3:
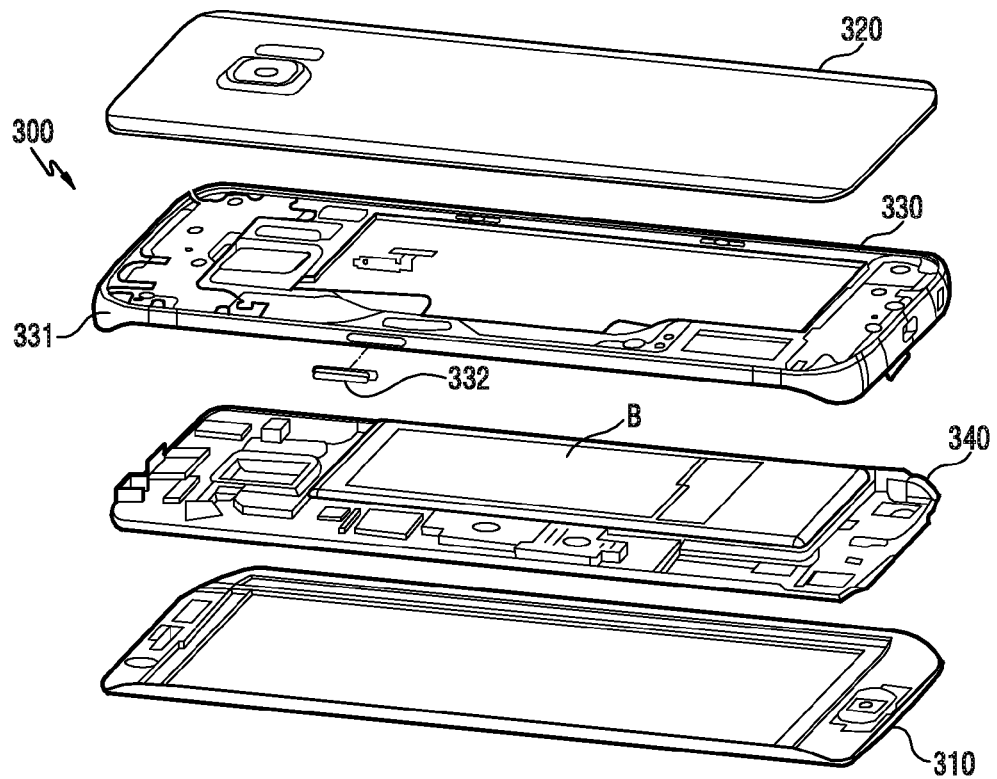
FIG. 3 is an exploded perspective view illustrating major parts of an electronic device according to various embodiments of the present disclosure.

FIG. 3 is an exploded perspective view illustrating major parts of an electronic device according to various embodiments of the present disclosure.

Referring to FIG. 3, the electronic device 300, according to the various embodiments of the present disclosure, may have one or more members on the outer surface thereof, which relate to the external appearance of the electronic device. For example, exterior members, such as a front cover 310, a back cover 320, a case 330 that includes a sidewall 331 located on the side surface of the electronic device 300, and the like, may cover most of the external appearance of the electronic device 300. In addition, the electronic device 300 may have a home key, a receiver, or the like on the front thereof, a rear camera, a flash, or a speaker on the back thereof, and a plurality of physical keys, a connector, a microphone hole, or the like on the sidewall 331 thereof.

The electronic device 300, according to the various embodiments, may require a structure for protecting the members disposed on the exterior thereof from an external environment, for example, a structure for preventing foreign substances (such as water) from infiltrating therein. A waterproof structure for a side key 332 disposed on the side surface of the case 330, among the members relating to the exterior of the electronic device, will be described below.

The electronic device 300, according to the various embodiments of the present disclosure, may include the front cover 310, the back cover 320, the case 330, a structure 340, and the waterproof structure.

The front cover 310, according to various embodiments, may form the front of the electronic device 300 and may serve as the front exterior of the electronic device 300. The front cover of the electronic device 300, according to the various embodiments, may be formed of a transparent member. For example, the transparent member may include a transparent synthetic resin or transparent glass. The display supported on the structure may include a screen area that is exposed through the front cover.

The back cover 320, according to various embodiments, may form the back of the electronic device 300 and may serve as the rear exterior of the electronic device 300. The back cover 320 of the electronic device 300, according to the various embodiments, may be formed of a transparent or opaque member. For example, the transparent member may include a transparent synthetic resin or transparent glass, and the opaque member may include a translucent/opaque synthetic resin, metal, or the like.

The sidewall 331 of the case 330, according to various embodiments, may form the outer peripheral surface of the electronic device 300 and may serve as the side exterior of the electronic device 300. The sidewall 331 of the electronic device, according to the various embodiments, may be formed of a conductive material (i.e., a conductive sidewall). For example, the sidewall may be formed of a metal material and may operate as an antenna radiator. The sidewall 331, according to the various embodiments, may surround at least a part of the space formed between the front cover 310 and the back cover 320. The sidewall 331, according to the various embodiments, may be integrally formed with a conductive structure or a non-conductive structure.

The internal space of the electronic device 300, according to the various embodiments, which are formed by the front cover 310, the back cover 320, and the sidewall 331, may be divided into a first space (illustrated in FIG. 4B) and a second space (illustrated in FIG. 4B) by the rear case 330. The internal space may be divided into the first space on one side of the rear case 330 toward the rear case 320 and the second space on the opposite side of the rear case 330 toward the front cover 310.

According to various embodiments, a plurality of structures 340 may be provided. A first structure may be configured to support the display, the printed circuit board, and the like, and a second structure may be configured to support the exterior members. For example, a structure may be configured to support and protect other components, such as a battery B. The structure 340, according to the various embodiments, may be formed of a synthetic resin, metal, or a combination thereof, and may also be formed of a metal alloy containing magnesium.

A waterproof structure, according to various embodiments of the present disclosure, will be described below with reference to the accompanying drawings.

Figure 4A:
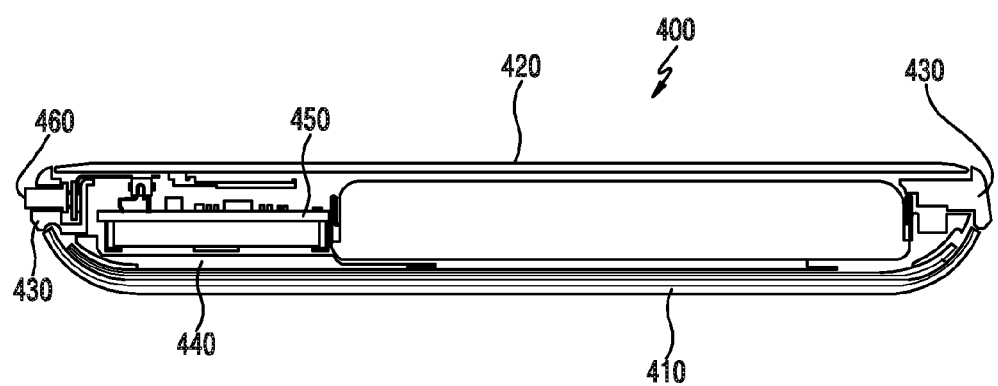
FIG. 4A illustrates a sectional view of an electronic device according to various embodiments of the present disclosure.
Figure 4B:
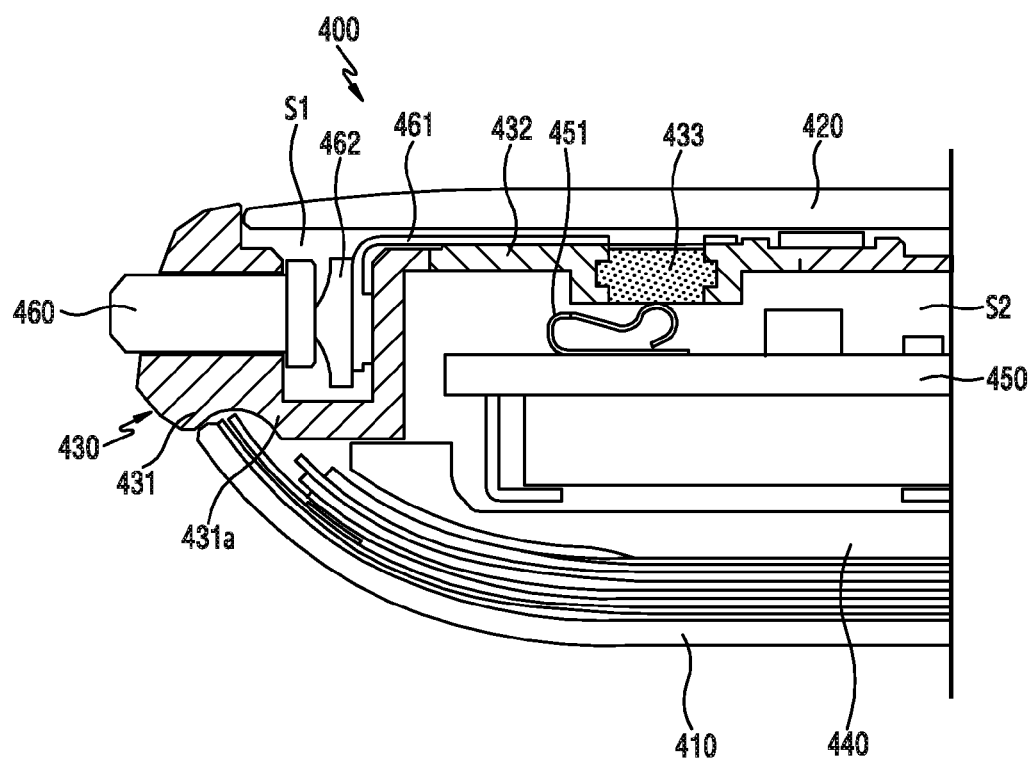
FIG. 4B is an enlarged sectional view illustrating major parts of the electronic device according to the various embodiments of the present disclosure.
Figure 4C:
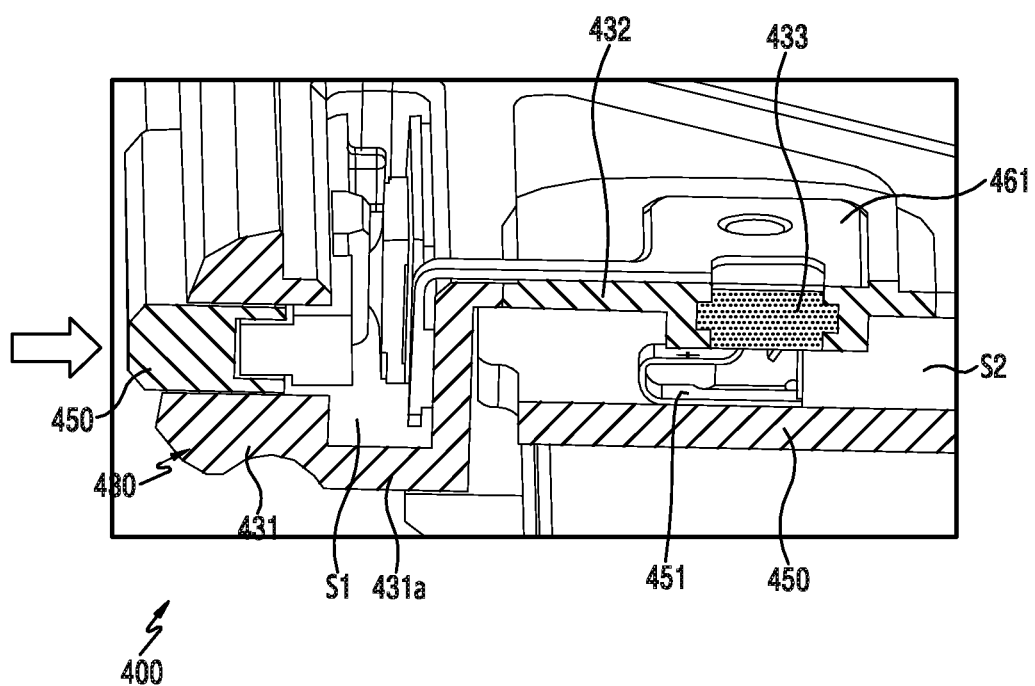
FIG. 4C is an enlarged cutaway perspective view illustrating the major parts of the electronic device according to the various embodiments of the present disclosure.

FIG. 4A illustrates a sectional view of an electronic device according to various embodiments of the present disclosure. FIG. 4B is an enlarged sectional view illustrating major parts of the electronic device according to the various embodiments of the present disclosure. FIG. 4C is an enlarged cutaway perspective view illustrating the major parts of the electronic device according to the various embodiments of the present disclosure.

Referring to FIGS. 4A to 4C, the electronic device 400, according to the various embodiments, may be an electronic device that is the same as the electronic device 100 illustrated in FIGS. 1A to 1C. The electronic device 400, according to the various embodiments of the present disclosure, may include a front cover 410, a back cover 420, a case 430, an internal support 440, and a waterproof structure. The electronic device, according to the various embodiments, may include first and second spaces S1 and S2 partitioned by the case 430. The first and second spaces S1 and S2 may be determined based on whether the main PCB 450 exists therein. If the main PCB 450 exists, the space may be the second space S2. In contrast, if the main PCB 450 does not exist, the space may be the first space S1. The electronic device 400, according to the various embodiments, may have a key 460 and a second conductive member 461 that are disposed in the first space S1 and the main PCB 450 and a third conductive member 451 that are disposed in the second space S2.

The first space S1, according to various embodiments, may be configured such that it communicates with at least one opening (illustrated in FIG. 5) that is formed in a sidewall 431 and at least a part thereof is surrounded by a part of the sidewall 431 and/or a part of the case 430.

The second space S2, according to various embodiments, may be configured such that it is hermetically sealed from the first space S1 and at least a part thereof is surrounded by another part of the case 430 and a non-conductive structure 432. While a waterproof structure is not provided for the first space S1, a waterproof structure may be provided for the second space S2.

The case 430, according to the various embodiments, may be defined as a rear structure or a rear case since it is disposed on the rear portion of the electronic device 400. The case 430, according to the various embodiments, may be disposed within the space of the electronic device 400. A part of the case 430 may be exposed to the outside to serve as the sidewall 431, and the rest of the case 430 may extend from the sidewall 431 and may be disposed within the electronic device 400 to function to support a conductive member 433. The case 430, according to the various embodiments, may include: a first surface directed toward the front cover 410; a second surface that is opposite to the first surface and is directed toward the back cover 420; and a through-hole (referring to the space occupied by the non-conductive structure 432) that extends from the first surface to the second surface thereof.

The case 430, according to the various embodiments, may be configured only with a conductive structure, only with a non-conductive structure, or with a combination of a conductive structure and a non-conductive structure. The case 430, according to the various embodiments, may include a first conductive structure 431a directed toward the sidewall 431 and the non-conductive structure 432 extending from the first conductive structure 431a.

The non-conductive structure 432, according to various embodiments, may include a first surface directed toward the front cover 410 and a second surface directed toward the back cover 420. The non-conductive structure 432 may fill the through-hole and may include a via-hole in which the conductive connecting member 433, which will be described below, is located.

The first conductive connecting member 433, according to various embodiments, may be formed of a rigid material and may include a first surface directed toward the front cover 410 and a second surface directed toward the back cover 420. The first conductive connecting member 433, according to the various embodiments, may be formed of the same material as that of the conductive sidewall 431. For example, the same material may be a metal material.

The second conductive connecting member 461 may be employed in order to electrically connect a signal generated by pressing the key 460, according to the various embodiments, to the main PCB 450. For example, the second conductive connecting member 461 may be a flexible printed circuit board (FPCB) made of a flexible material and may function to electrically connect a signal generated by pressing the key 460 to the first conductive member 433.

The second conductive connecting member 461, according to the various embodiments, may be configured such that a part thereof is located within the first space S1, another part thereof extends to the second surface of the non-conductive structure 432, and yet another part thereof makes electrical contact with the first conductive connecting member 433.

A signal generated by the operation of the key 460 may be electrically connected to the main PCB 450 by the first and second conductive connecting members 433 and 461 according to the various embodiments.

The electronic device 400, according to the various embodiments, may include the third conductive connecting member 451 that electrically connects the first conductive connecting member 433 and the main PCB 450. The third conductive connecting member 451, according to various embodiments, which is a clip-shaped terminal with resilience, may be secured to the main PCB 450 and may be closely connected to the first conductive connecting member 433. The third conductive connecting member 451, according to the various embodiments, may include a fixed end and a free end. The fixed end may be secured to the main PCB 450, and the free end may be brought close to the first conductive connecting member 433.

The electronic device 400, according to the various embodiments, may include at least one side key 460 among the plurality of exterior members. The side key 460, according to various embodiments, may be a member that has a size and shape sufficient to pass through at least one opening (illustrated in FIG. 5) that is formed in the sidewall 431. The side key 460, according to the various embodiments, may operate while being inserted into the at least one opening so as to move in a direction that is substantially perpendicular to the opening.

The side key 460, according to the various embodiments, may move in a direction substantially perpendicular to the at least one opening to generate an electrical signal in a part of the second conductive connecting member 461 that is located within the first space S1 when an external pressure is applied to the side key 460 in the first direction. The pressure directed in the first direction may be a physical press made by a user.

The second conductive connecting member 461, according to the various embodiments, may further include a dome structure 462 configured to make contact with the key 460 when a pressure is applied to the key 460 in the first direction. For example, the dome structure 462 may include a metal dome switch. The dome structure 462, according to various embodiments, may generate a signal when the dome section thereof is pressed, and may provide a force for returning the side key 460 to the original position.

Figure 5:
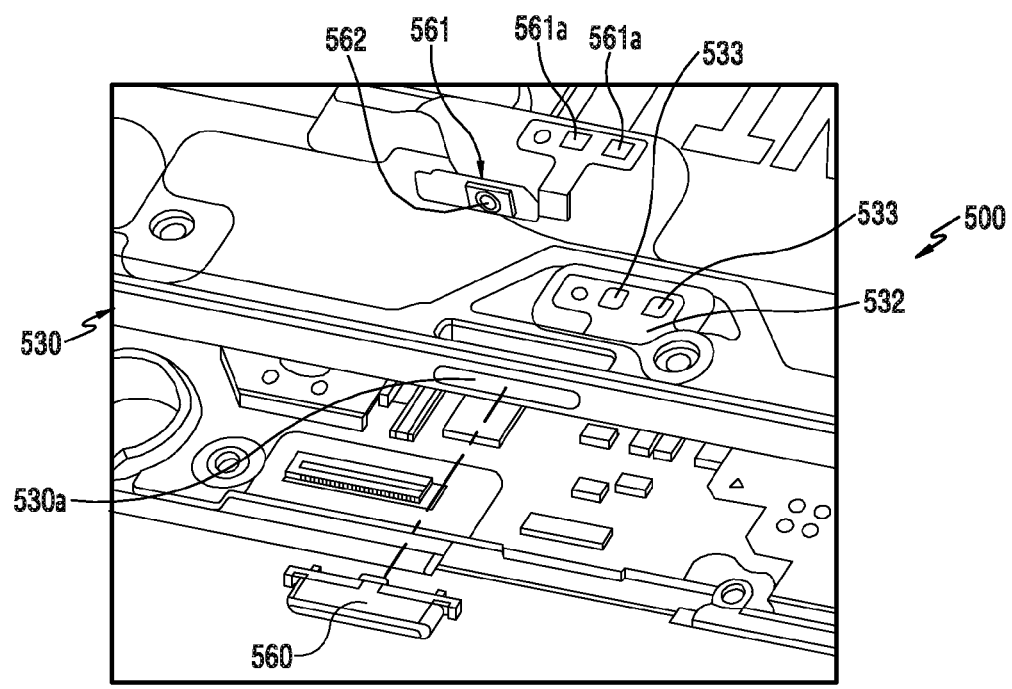
FIG. 5 is an enlarged partial perspective view illustrating major parts of an electronic device according to various embodiments of the present disclosure.

FIG. 5 is an enlarged partial perspective view illustrating major parts of an electronic device according to various embodiments of the present disclosure.

Referring to FIG. 5, the electronic device 500, according to the various embodiments, may be an electronic device that is the same as the electronic device 100 illustrated in FIGS. 1A to 1C. The electronic device 500, according to the various embodiments of the present disclosure, may have a side key 560 that is placed in an opening 530a formed in a case 530 to bear an axial pressure.

A second conductive connecting member 561, according to various embodiments, may have a dome structure 562 on at least one end portion thereof and may be placed in the opening 530a. The second conductive connecting member 561 may extend along the case 530 to have a length sufficient to reach a non-conductive structure 532. The second conductive connecting member 561, according to the various embodiments, may have one or more connection pads 561a on an opposite end portion thereof. While two connection pads 561a are illustrated in FIG. 5, the number of connection pads does not need to be limited thereto.

The electronic device 500, according to the various embodiments, may have one or more first conductive connecting members 533. While two first conductive connecting members 533 are illustrated in FIG. 5, the number of first conductive connecting members does not need to be limited thereto.

The connection pads 561a may be electrically connected and integrated with the first conductive connecting members 533 by ultrasonic welding, respectively.

Figure 6A:
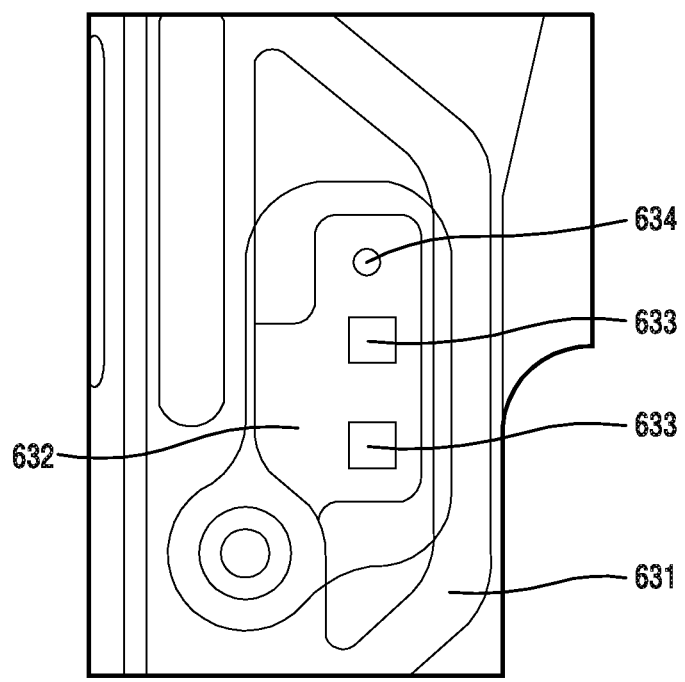
FIG. 6A is an enlarged front view of a conductive structure of an electronic device according to various embodiments of the present disclosure.
Figure 6B:
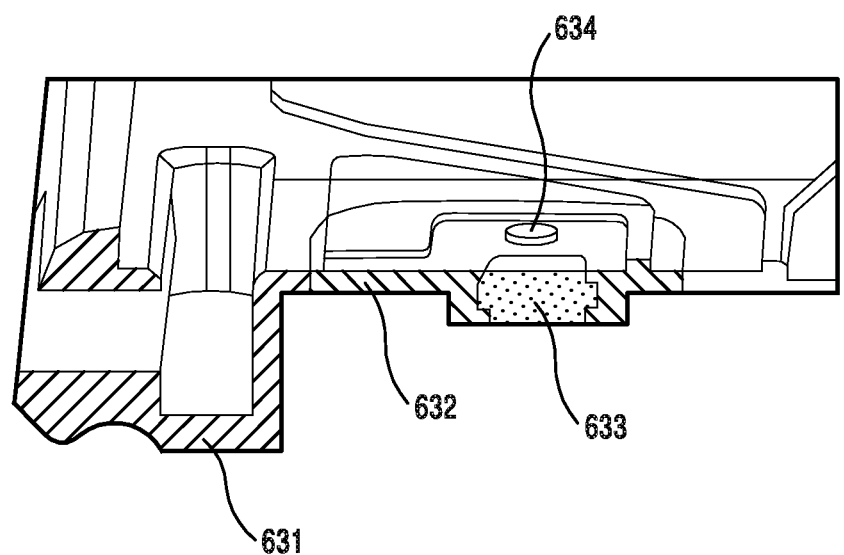
FIG. 6B is a cutaway perspective view illustrating the conductive structure of the electronic device according to the various embodiments of the present disclosure.

FIG. 6A is an enlarged front view of a conductive structure of an electronic device according to various embodiments of the present disclosure. FIG. 6B is a cutaway perspective view illustrating the conductive structure of the electronic device according to the various embodiments of the present disclosure.

Referring to FIGS. 6A and 6B, the electronic device, according to the various embodiments, may include the conductive structure, such as a sidewall 631, and a non-conductive structure 632. The non-conductive structure 632, according to various embodiments, may include one or more first conductive connecting members 633 and a protrusion 634. The first conductive connecting members 633 may be formed of the same material as that of the conductive sidewall 631. For example, the same material may be a metal material.

The protrusion 634, according to various embodiments, may serve as a holder for guiding a coupling position in the assembly of a second conductive connecting member. The protrusion 634 may have a shape that protrudes upward from the bottom by a specified thickness.

Figure 7A:
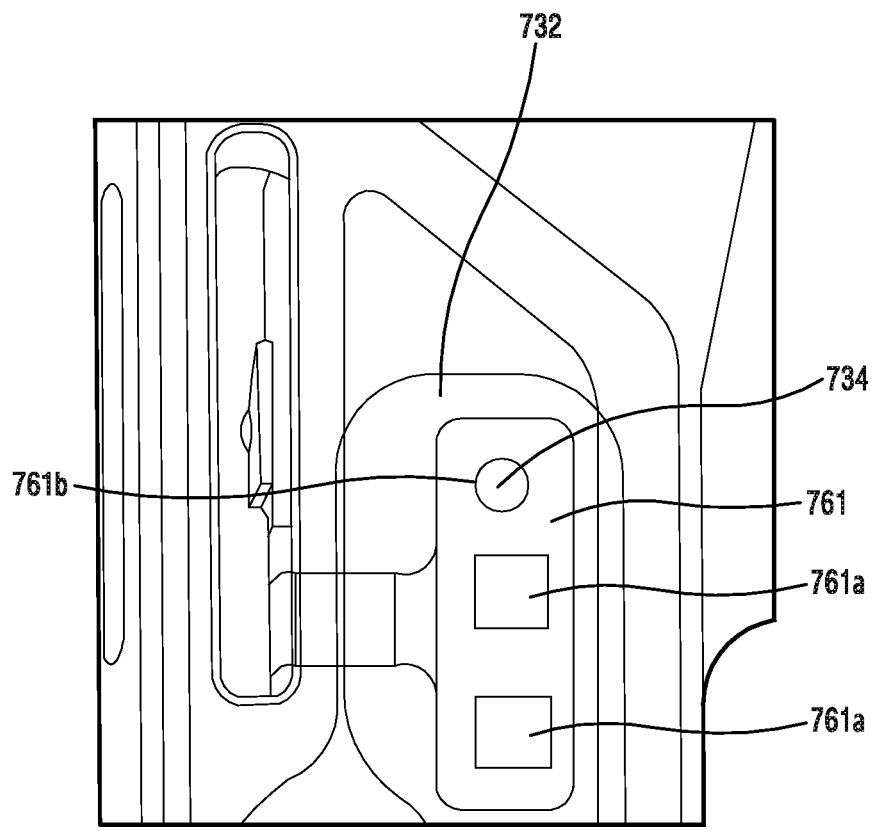
FIG. 7A is an enlarged front view illustrating a state in which a conductive structure and a second conductive connecting member of an electronic device, according to various embodiments of the present disclosure, are coupled with each other.
Figure 7B:
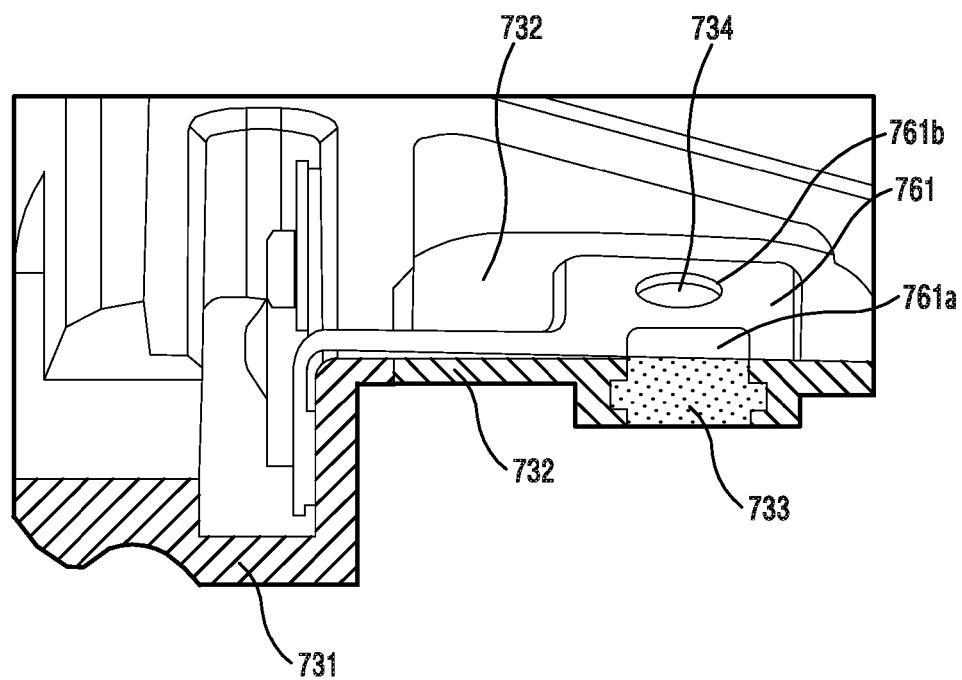
FIG. 7B is a cutaway perspective view illustrating a state in which a conductive structure and a second conductive connecting member of the electronic device are coupled with each other, according to the various embodiments of the present disclosure.

FIG. 7A is an enlarged front view illustrating a state in which a conductive structure and a second conductive connecting member of an electronic device, according to various embodiments of the present disclosure, are coupled with each other through an ultrasonic wave process. FIG. 7B is a cutaway perspective view illustrating the state in which the conductive structure and the second conductive connecting member of the electronic device, according to the various embodiments of the present disclosure, are coupled with each other through the ultrasonic wave process.

Referring to FIGS. 7A and 7B, the electronic device, according to the various embodiments, may have a conductive structure 732 and a second conductive connecting member 761 that are integrated with each other and connected and secured to each other by an ultrasonic wave process. The second conductive connecting member 761, according to various embodiments, may include at least one connection pad 761a and an opening 761b for holding. The connection pad 761a, according to various embodiments, is a part coupled with a first conductive connecting member 733 through ultrasonic welding, and may have a flat surface. The opening 761b for holding, according to various embodiments, is a hole coupled with a protrusion 734. The opening 761b may guide the coupling position of the second conductive connecting member 761 while being coupled with the protrusion 734.

The connection pad 761a of the second conductive connecting member and the first conductive connecting member 733, according to the various embodiments, may be fused together by means of ultrasonic welding therebetween while making surface-to-surface contact with each other to form a single body and provide an electrical connecting path. According to various embodiments, sidewalls 731 may be formed of conductive structure or may be formed of non-conductive structure. In an embodiment, sidewalls 731 may include a same conductive material as conducting structure 732; or, according to another embodiment, sidewalls 731 may be formed of a different conductive material than that of 732.

Figure 8:
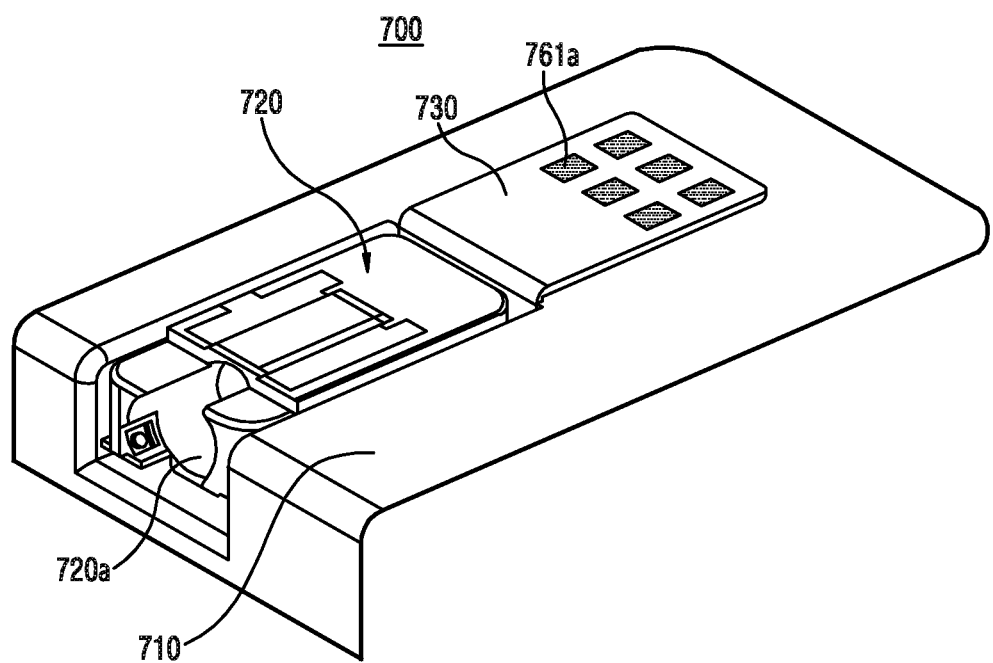
FIG. 8 is a perspective view illustrating an earphone jack of an electronic device, the earphone jack having a waterproof structure according to various embodiments of the present disclosure.
Figure 9:
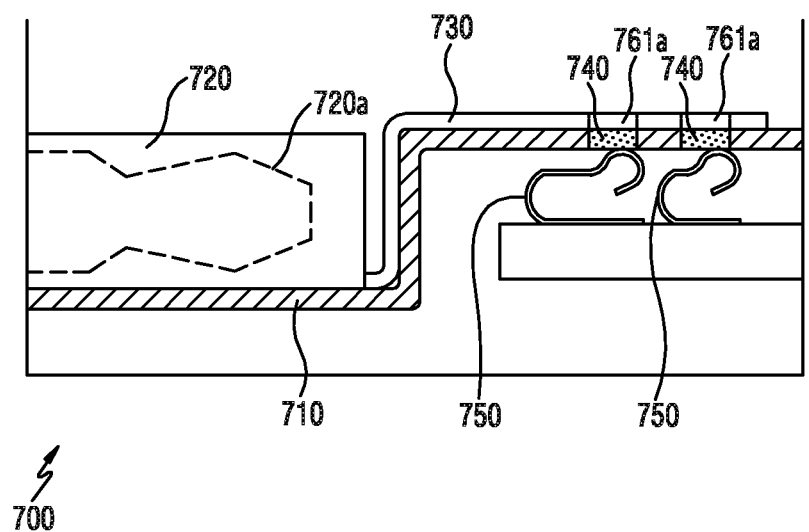
FIG. 9 is a sectional view illustrating an earphone jack of an electronic device, the earphone jack having a waterproof structure according to the various embodiments of the present disclosure.

FIG. 8 is a perspective view of an earphone jack with a waterproof structure according to various embodiments of the present disclosure. FIG. 9 is a sectional view of the earphone jack with the waterproof structure according to the various embodiments of the present disclosure.

An electronic device 700 with a waterproof structure, according to various embodiments of the present disclosure, will be described with reference to FIGS. 8 and 9.

Referring to FIGS. 8 and 9, the electronic device 700, according to the various embodiments, may be an electronic device that is the same as the electronic device 100 illustrated in FIGS. 1A to 1C. The waterproof structure, according to the various embodiments of the present disclosure, may be identically applied to an earphone jack waterproof structure among the members relating to the external appearance of the electronic device 700. A typical earphone jack may be inserted into an earphone jack connector 720 mounted in the electronic device 700 in order to listen to a sound.

The waterproof structure for the earphone jack connector 720, according to various embodiments, may include the earphone jack connector 720, an electrical connecting member 730, conductive connecting members 740, and conductive connecting members 750 with resilience.

The electrical connecting member 730, according to various embodiments, may include, for example, a FPCB that electrically connects the earphone jack connector 720 to the conductive connecting members 740.

The electrical connecting member 730, according to the various embodiments, may have one or more connection pads 761a on end portions thereof, which are connected to the conductive connecting members 740, respectively. While six connection pads 761a are illustrated in the drawing, the number of connection pads 761a is not limited thereto. For example, if an earphone jack is connected through four pins, four connection pads may be provided. For example, the four connection pads may be a right speaker terminal, a left speaker terminal, a ground terminal, and a microphone terminal. A left ANC microphone terminal and a right ANC microphone terminal may be additionally added, in which case six connection pads may be provided.

The waterproof structure for the earphone jack connector 720 of the electronic device 700, according to the various embodiments, may include one or more conductive connecting members 740 formed in a case 710. Since the configurations of the conductive connecting members 740 and the conductive connecting members 750 with resilience are the same as those of the first conductive connecting member 433 and the third conductive connecting member 551 illustrated in FIGS. 4A to 4C, a detailed description thereof will be omitted. Reference numeral 720a denotes an earphone jack insertion hole.

Figure 10:
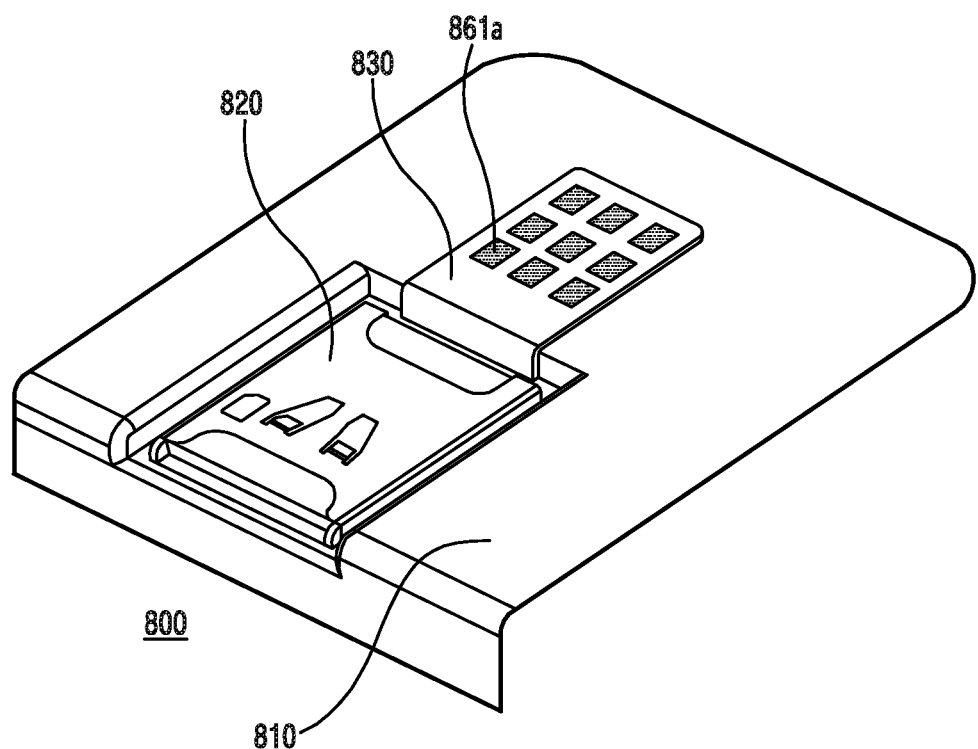
FIG. 10 is a perspective view illustrating a SIM card of an electronic device, the SIM card having a waterproof structure according to various embodiments of the present disclosure.
Figure 11:
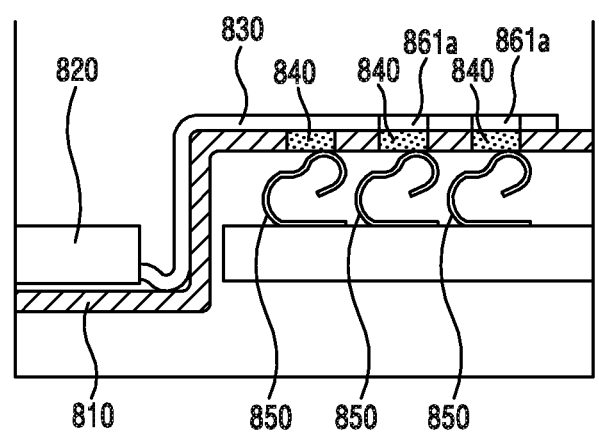
FIG. 11 is a sectional view illustrating a SIM card of an electronic device, the SIM card having a waterproof structure according to the various embodiments of the present disclosure.

FIG. 10 is a perspective view of a SIM card with a waterproof structure according to various embodiments of the present disclosure. FIG. 11 is a sectional view of the SIM card with the waterproof structure according to the various embodiments of the present disclosure.

An electronic device 800 with a waterproof structure, according to various embodiments of the present disclosure, will be described with reference to FIGS. 10 and 11.

The electronic device 800, according to the various embodiments, may be an electronic device that is the same as the electronic device 100 illustrated in FIGS. 1A to 1C. The waterproof structure, according to the various embodiments of the present disclosure, may be identically applied to a waterproof structure for a chip or card (e.g., a SIM card) that is mounted in a rear case of the electronic device 800. The typical SIM card 820 may be attached or detached in a drawer manner using a tray installed in the electronic device 800, or may be attached to or detached from a socket provided in the electronic device 800. The SIM card socket enables the SIM card 820 to be stably connected to a PCB.

The waterproof structure for the SIM card 820, according to various embodiments, may include an electrical connecting member 830, conductive connecting members 840, and conductive connecting members 850 with resilience.

The electrical connecting member 830, according to various embodiments, may include, for example, a FPCB that electrically connects the SIM card 820 to the conductive connecting members 840.

The electrical connecting member 830, according to the various embodiments, may have one or more connection pads 861a on end portions thereof, which are connected to the conductive connecting members 840, respectively. While nine connection pads 861a are illustrated in the drawing, the number of connection pads 861a is not limited thereto.

The waterproof structure for the SIM card 820 of the electronic device 800, according to the various embodiments, may include one or more conductive connecting members 840 formed in a case 810. Since the configurations of the conductive connecting members 840 and the conductive connecting members 850 with resilience are the same as those of the first conductive connecting member 433 and the third conductive connecting member 451 illustrated in FIGS. 4A to 4C, a detailed description thereof will be omitted.

A portable electronic device, according to various embodiments of the present disclosure, may include: a front cover configured to form the front of the electronic device; a back cover configured to form the back of the electronic device; a sidewall configured to surround at least a part of the space formed between the front cover and the back cover; a display device located in the space and including a screen area exposed through the front cover; a structure located within the space and extending from the sidewall, the structure including a first surface directed toward the front cover, a second surface directed toward the back cover, and a through-hole extending from a part of the first surface to a part of the second surface; a non-conductive structure with which the through-hole of the structure is filled, the non-conductive structure including a first surface directed toward the front cover, a second surface directed toward the back cover, and a via-hole; a first conductive connecting member with which the via-hole of the non-conductive structure is filled, the first conductive connecting member including a first surface directed toward the front cover and a second surface directed toward the back cover; a first space communicating with at least one opening formed in the sidewall, at least a part of the first space being surrounded by a part of the sidewall and/or a part of the structure; a second conductive connecting member disposed such that a part thereof is located within the first space, another part thereof extends to the second surface of the non-conductive structure, and yet another part thereof makes electrical contact with the first conductive connecting member; a second space at least partially surrounded by another part of the structure and the non-conductive structure so as to be hermetically sealed from the first space; and a printed circuit board disposed within the second space and electrically connected with the first conductive connecting member.

According to various embodiments of the present disclosure, the sidewall may include a conductive sidewall.

According to various embodiments of the present disclosure, the structure may include a conductive structure integrally formed with the conductive sidewall.

According to various embodiments of the present disclosure, the first conductive connecting member may contain the same metal material as that of the conductive sidewall.

According to various embodiments of the present disclosure, the second conductive connecting member may include a flexible printed circuit board (FPCB).

According to various embodiments of the present disclosure, the electronic device may further include a third conductive connecting member electrically connected between the first conductive connecting member and the printed circuit board.

According to various embodiments of the present disclosure, the electronic device may further include a key having a size and shape sufficient to pass through the at least one opening formed in the sidewall, the key being inserted into the at least one opening so as to move in a direction that is substantially perpendicular to the opening.

According to various embodiments of the present disclosure, the key may move in a direction substantially perpendicular to the at least one opening to generate an electrical signal in a part of the second conductive connecting member that is located within the first space when an external pressure is applied to the key in the first direction.

According to various embodiments of the present disclosure, the electronic device may further include a dome structure located on a part of the second conductive connecting member to make contact with the key when a pressure is applied to the key in the first direction.

An electronic device, according to various embodiments of the present disclosure, may include: a front cover; a back cover; a rear case disposed between the front cover and the back cover; a first space between the back cover and the rear case; a second space between the front cover and the rear case, the second space being hermetically sealed from the first space; a first conductive connecting member formed in the rear case, the first conductive connecting member including a first surface directed toward the front cover and a second surface directed toward the back cover; an electrical connecting member disposed such that a part thereof is located within the first space, another part thereof extends to a second surface of a non-conductive structure, and yet another part thereof makes electrical contact with the first conductive connecting member; and a printed circuit board disposed within the second space and electrically connected with the first conductive connecting member.

According to various embodiments of the present disclosure, the first and second surfaces of the first conductive connecting member may be flat surfaces.

According to various embodiments of the present disclosure, the electrical connecting member may include one or more connection pads.

According to various embodiments of the present disclosure, the connection pads and the first conductive connecting member may be bonded to each other by ultrasonic welding.

According to various embodiments of the present disclosure, the rear case may include a sidewall, and a side key may be disposed to be pressed in the lateral direction of the sidewall.

According to various embodiments of the present disclosure, a part of the rear case directed toward the sidewall may be formed of a conductive material, and a part of the rear case between the sidewall and the first conductive connecting member may be formed of a non-conductive material.

According to various embodiments of the present disclosure, the first conductive connecting member may be configured by forming a via-hole in the non-conductive structure and filling the via-hole.

According to various embodiments of the present disclosure, the first conductive connecting member may be electrically connected to the printed circuit board by a second conductive connecting member.

According to various embodiments of the present disclosure, the second conductive connecting member may have a clip shape with resilience. The fixed end of the second conductive connecting member may be secured to the printed circuit board, and the free end of the second conductive connecting member may be brought close to the first surface of the first conductive connecting member.

According to various embodiments of the present disclosure, the front cover may have at least one edge area that is formed in the shape of a curved surface.

According to various embodiments of the present disclosure, the electrical connecting member may be formed of a flexible material, and the first conductive connecting member may be formed of a rigid material.

Figure 12:
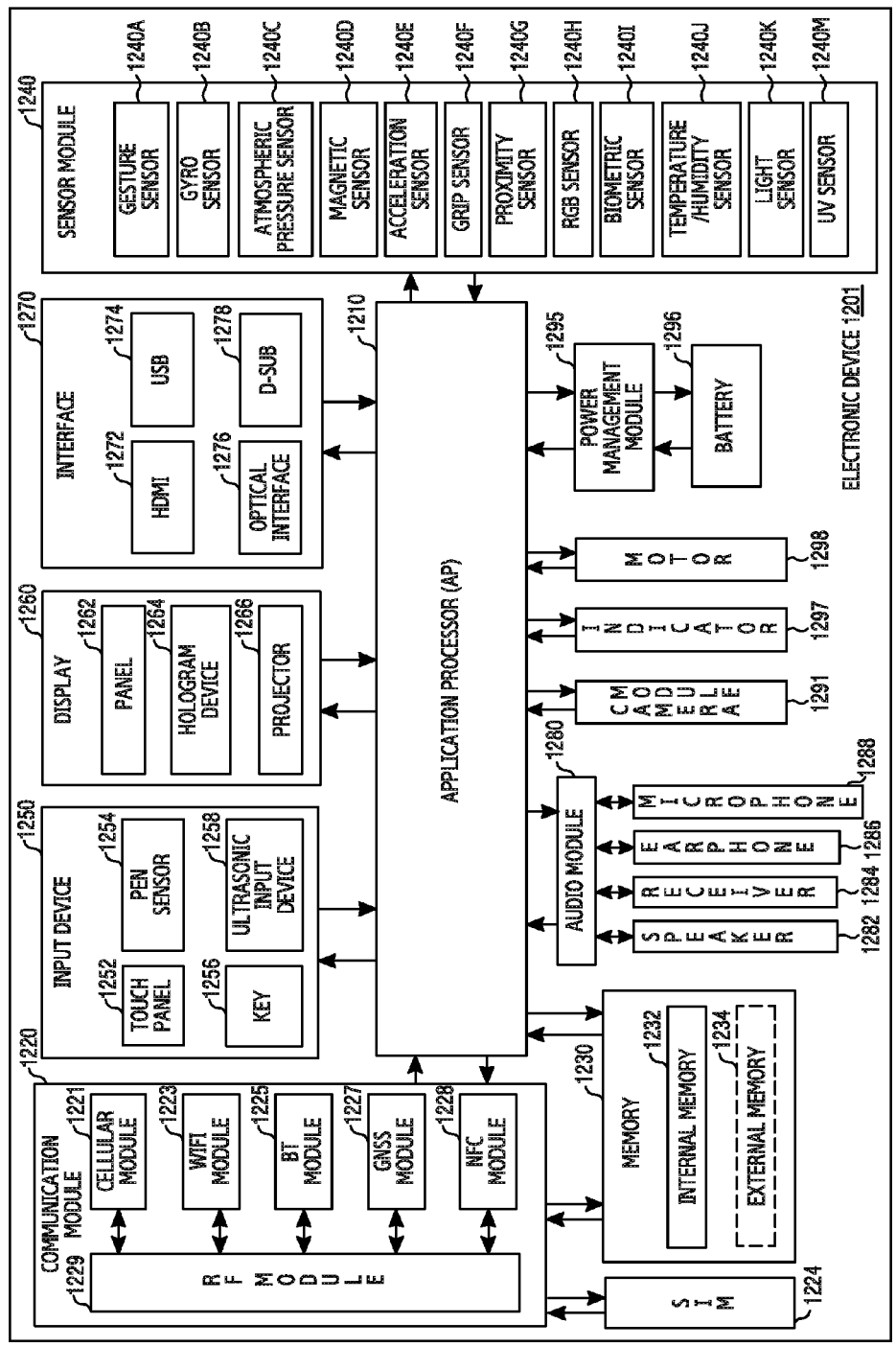
FIG. 12 is a block diagram illustrating a configuration of an electronic device according to various embodiments of the present disclosure.

FIG. 12 is a block diagram 1200 of an electronic device 1201 according to various embodiments of the present disclosure. The electronic device 1201 according to various embodiments may be the same as the electronic device 400 illustrated in FIGS. 4A and 4B. For example, the electronic device 1201 may be an imaging device, such as an action camera, or a video image photographing device. In particular, the electronic device 1201 may be a high speed video image photographing device.

Referring to FIG. 12, the electronic device 1201 includes an application processor (AP) 1210, a communication module 1220, a subscriber identification module (SIM) card 1224, a memory 1230, a sensor module 1240, an input device 1250, a display 1260, an interface 1270, an audio module 1280, a camera module 1291, a power management module 1295, a battery 1296, an indicator 1297, and a motor 1298.

The AP 1210 runs an operating system or an application program to control a plurality of hardware or software constituent elements connected to the AP 1210, and may perform processing and operation of various data including multimedia data. The AP 1210 may be, for example, implemented as a system on chip (SoC). According to an embodiment of the present disclosure, the AP 1210 further includes a graphical processing unit (GPU). The AP 1210 further includes at least one of other constitute elements (e.g., the cellular module 1221). The AP 1210 loads an instruction or data, which is received from a non-volatile memory connected to each or at least one of other constituent elements, to a volatile memory and processes the loaded instruction or data. In addition, the AP 1210 stores in the non-volatile memory, data received from at least one of the other constituent elements or generated by at least one of the other constituent elements.

The communication module 1220 performs data transmission/reception in communication between the electronic device 1201 and other electronic devices connected through a network. According to an embodiment of the present invention, the communication module 1220 includes cellular module 1221, a Wi-Fi module 1223, a BT module 1225, a GPS module 1227, an NFC module 1228, and a radio frequency (RF) module 1229.

The cellular module 1221 provides a voice telephony, a video telephony, a text service, an Internet service, and the like, through a telecommunication network (e.g., LTE, LTE-A, CDMA, WCDMA, UMTS, WiBro, GSM, and the like). In addition, the cellular module 1221 may, for example, use a SIM card 1224 to perform electronic device distinction and authorization within the telecommunication network. According to an embodiment of the present disclosure, the cellular module 1221 may perform at least some of functions that the AP 1210 may provide. For example, the cellular module 1221 performs at least one part of a multimedia control function.

The WiFi module 1223, the BT module 1225, the GPS module 1227 and the NFC module 1228 each may include, for example, a processor for processing data transmitted/received through the corresponding module. According to an embodiment of the present disclosure, at least some (e.g., two or more) of the cellular module 1221, the WiFi module 1223, the BT module 1225, the GPS module 1227 and the NFC module 1228 are included within one IC or IC package.

The RF module 1229 performs transmission/reception of data, for example, transmission/reception of an RF signal. The RF module 1229 may include, for example, a transceiver, a power amplifier module (PAM), a frequency filter, a low noise amplifier (LNA), an antenna and the like. According to an embodiment of the present disclosure, at least one of the cellular module 1221, the WiFi module 1223, the BT module 1225, the GPS module 1227 or the NFC module 1228 may perform transmission/reception of an RF signal through a separate RF module.

The SIM card 1224 includes a SIM, and may be inserted into a slot provided in a specific position of the electronic device 1201. The SIM card 1224 includes unique identification information (e.g., an integrated circuit card ID (IC-CID)) or subscriber information (e.g., an international mobile subscriber identity (IMSI)).

The memory 1230 includes an internal memory 1232 or an external memory 1234. The internal memory 1232 includes, for example, at least one of a volatile memory (e.g., a dynamic random access memory (DRAM), a static RAM (SRAM) and a synchronous DRAM (SDRAM)) or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory).

According to an embodiment of the present disclosure, the internal memory 1232 may be a solid state drive (SSD). The external memory 1234 may further include a flash drive, for example, compact flash (CF), secure digital (SD), micro-SD, mini-SD, extreme digital (xD), a memory stick, and the like. The external memory 1234 may be operatively connected with the electronic device 1201 through various interfaces.

The sensor module 1240 measures a physical quantity or detects an activation state of the electronic device 1201, and converts measured or detected information into an electric signal. The sensor module 1240 includes, for example, at least one of a gesture sensor 1240A, a gyro sensor 1240B, an air pressure sensor 1240C, a magnetic sensor 1240D, an acceleration sensor 1240E, a grip sensor 1240F, a proximity sensor 1240G, a color sensor 1240H (e.g., a red, green, blue (RGB) sensor), a bio-physical sensor 1240I, a temperature/humidity sensor 1240J, an illumination sensor 1240K, a ultraviolet (UV) sensor 1240M, and the like. Additionally or alternatively, the sensor module 1240 may also include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor, and the like. The sensor module 1240 may further include a control circuit for controlling at least one or more sensors belonging therein.

The input device 1250 includes a touch panel 1252, a (digital) pen sensor 1254, a key 1256, an ultrasonic input device 1258, and the like. The touch panel 1252 may, for example, detect a touch input in at least one of a capacitive overlay scheme, a pressure sensitive scheme, an infrared beam scheme, and an acoustic wave scheme. The touch panel 1252 may also include a control circuit. In a case of the capacitive overlay scheme, physical contact or proximity detection is possible. The touch panel 1252 may further include a tactile layer, to provide a tactile response to a user.

The (digital) pen sensor 1254 may be implemented in the same or similar method to receiving a user's touch input or by using a separate sheet for detection. The key 1256 may include, for example, a physical button, an optical key, or a keypad. The ultrasonic input device 1258 is capable of identifying data by detecting a sound wave in the electronic device 1201 through an input tool generating an ultrasonic signal, and enables wireless detection. According to an embodiment of the present disclosure, the electronic device 1201 may also use the communication module 1220 to receive a user input from a connected external device (e.g., a computer or a server).

The display 1260 includes a panel 1262, a hologram device 1264, or a projector 1266. The panel 1262 may be, for example, an LCD, an Active-Matrix Organic LED (AMO-LED), and the like. The panel 1262 may be, for example, implemented to be flexible, transparent, or wearable. The panel 1262 may be constructed as one module along with the touch panel 1252 as well. The hologram device 1264 may use interference of light to show a three-dimensional image in the air. The projector 1266 may project light to a screen to display an image. The screen may be, for example, located inside or outside the electronic device 1201. According to an embodiment of the present disclosure, the display 1260 may further include a control circuit for controlling the panel 1262, the hologram device 1264, or the projector 1266.

The interface 1270 includes, for example, a high-definition multimedia interface (HDMI) 1272, a universal service bus (USB) 1274, an optical interface 1276, or a D-submin-iature (D-sub) 1278. Additionally or alternatively, the interface 1270 includes, for example, a mobile high-definition link (MHL) interface, an SD card/multimedia card (MMC) interface or an infrared data association (IrDA) standard interface.

The audio module 1280 converts a voice and an electric signal interactively. The audio module 1280 may, for example, process sound information which is inputted or outputted through a speaker 1282, a receiver 1284, an earphone 1286, the microphone 1288, and the like.

The camera module 1291 takes still pictures and moving pictures. According to an embodiment of the present disclosure, the camera module 1291 includes one or more image sensors (e.g., a front sensor or a rear sensor), a lens, an image signal processor (ISP), or a flash (e.g., an LED or a xenon lamp).

The power management module 1295 manages electric power of the electronic device 1201. The power management module 1295 includes, for example, a power management integrated circuit (PMIC), a charger IC, a battery, a battery gauge, and the like.

The PMIC may be, for example, mounted within an integrated circuit or an SoC semiconductor. A charging scheme may be divided into a wired charging scheme and a wireless charging scheme. The charger IC charges the battery 1296, and prevents the inflow of overvoltage or overcurrent from an electric charger. According to an embodiment of the present disclosure, the charger IC includes a charger IC for at least one of the wired charging scheme or the wireless charging scheme. The wireless charging scheme may, for example, be a magnetic resonance scheme, a magnetic induction scheme, an electromagnetic wave scheme, and the like. A supplementary circuit for wireless charging, for example, a circuit, such as a coil loop, a resonance circuit, a rectifier, and the like, may be added.

The battery gauge may, for example, measure a level of the battery 1296, a voltage during charging, a current or a temperature. The battery 1296 generates or stores electricity, and uses the stored or generated electricity to supply power to the electronic device 1201. The battery 1296 may include, for example, a rechargeable battery or a solar battery.

The indicator 1297 displays a specific status of the electronic device 1201 or one part (e.g., the AP 1210) thereof, for example a booting state, a message state, a charging state, and the like. The motor 1298 may convert an electric signal into a mechanical vibration. The electronic device 1201 may include a processing device (e.g., a GPU) for mobile TV support. The processing device for mobile TV support may, for example, process media data according to the standards of digital multimedia broadcasting (DMB), digital video broadcasting (DVB), a media flow, and the like.

Each of the above-described elements of the electronic device may include one or more components, and the name of a corresponding element may vary according to the type of electronic device. The electronic device according to the present disclosure may include at least one of the above-described elements and may exclude some of the elements or further include other additional elements. Further, some of the elements of the electronic device according to the present disclosure may be coupled to form a single entity while performing the same functions as those of the corresponding elements before the coupling.

The term "module," as used herein may represent, for example, a unit including a combination of one or two or more of hardware, software, or firmware. The "module" may be, for example, used interchangeably with the terms "unit", "logic", "logical block", "component", or "circuit" etc. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific integrated circuit (ASIC) chip, Field-Programmable Gate Arrays (FPGAs) and a programmable-logic device performing some operations known to the art or to be developed in the future.

At least a part of an apparatus (e.g., modules or functions thereof) or method (e.g., operations) according to the present disclosure may be, for example, implemented as instructions stored in a computer-readable storage medium in a form of a programming module. In case that the instruction is executed by a processor, and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a Compact Disc-Read Only Memory (CD-ROM) and a Digital Versatile Disc (DVD)), a Magneto-Optical Medium (e.g., a floptical disk), and a hardware device (e.g., a Read Only Memory (ROM), a Random Access Memory (RAM), a flash memory, etc.). Also, the program instruction may include not only a mechanical language code such as a code made by a compiler but also a high-level language code executable by a computer using an interpreter, etc. The aforementioned hardware device may be constructed to operate as one or more software modules in order to perform operations of the present disclosure, and vice versa.

The module or programming module according to the present disclosure may include at least one or more of the aforementioned constituent elements, or omit some of the aforementioned constituent elements, or further include additional other constituent elements. Operations carried out by the module, the programming module or the other constituent elements according to the present disclosure may be executed in a sequential, parallel, repeated or heuristic method. Also, some operations may be executed in different order or may be omitted, or other operations may be added.

Accordingly, a method and electronic device are provided for controlling a display according to the present disclosure, to determine the priority of display based on a user's preference, thereby being able to decrease a search time for display and more quickly display a desired screen.

While the present disclosure has been shown and described with reference to certain embodiments thereof, it will be apparent to those skilled in the art that the camera lens module according to the present disclosure is not limited to these embodiments, and various changes in form and details may be made therein without departing from the spirit and scope of the present disclosure as defined by the appended claims. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A portable electronic device comprising:
    a front cover configured to form a front of the electronic device;
    a back cover configured to form a back of the electronic device;
    a sidewall configured to surround at least a portion of an internal space formed between the front cover and the back cover;
    a display device located in the internal space and comprising a screen area configured to be exposed through the front cover;
    a first structure located within the internal space and extending from the sidewall, the first structure comprising a first surface directed toward the front cover, a second surface directed toward the back cover, and a through-hole extending from the first surface to the second surface;
    a non-conductive structure disposed within and filling the through-hole, the non-conductive structure comprising a third surface directed toward the front cover, a fourth surface directed toward the back cover, and a via-hole;
    a first conductive connecting member disposed within and filling the via-hole of the non-conductive structure, the first conductive connecting member comprising a fifth surface directed toward the front cover and a sixth surface directed toward the back cover;
    a printed circuit board electrically connected with the first conductive connecting member;
    a first space communicating with at least one opening formed in the sidewall, at least a part of the first space being surrounded by at least one of a part of the sidewall or a part of the first structure; and
    a second space at least partially surrounded by another part of the first structure and the non-conductive structure, the second space configured to be hermetically sealed from the first space;
    wherein the printed circuit board is disposed within the second space.

2. The portable electronic device of claim 1, wherein the sidewall comprises a conductive sidewall.

3. The portable electronic device of claim 2, wherein the first structure comprises a conductive structure integrally formed with the conductive sidewall.

4. The portable electronic device of claim 2, wherein the first conductive connecting member comprises a same metal material as the conductive sidewall.

5. The portable electronic device of claim 1, further comprising a third conductive connecting member electrically connected and disposed between the first conductive connecting member and the printed circuit board.

6. The portable electronic device of claim 1, further comprises:
    a second conductive connecting member comprising a first part, a second part, and a third part,
    the first part disposed within the first space,
    the second part extending to the fourth surface of the non-conductive structure, and
    the third part electrically contacting the first conductive connecting member.

7. The portable electronic device of claim 6, wherein the second conductive connecting member comprises a flexible printed circuit board (FPCB).

8. The portable electronic device of claim 6, further comprising a key having a size and shape configured to be inserted into the at least one opening formed in the sidewall, wherein the key is inserted by a movement in a direction substantially perpendicular to the at least one opening.

9. The portable electronic device of claim 7, wherein the second conductive connecting member further comprises a dome structure configured to make contact with the key when a pressure is applied to the key in the direction substantially perpendicular to the at least one opening.

10. The portable electronic device of claim 8, wherein the key is configured to generate an electrical signal in the first part of the second conductive connecting member that is disposed within the first space when an external pressure is applied to the key in the direction substantially perpendicular to the at least one opening.

11. An electronic device comprising:
a front cover;
a back cover;
a rear case disposed between the front cover and the back cover;
a first space formed between the back cover and the rear case;
a second space formed between the front cover and the rear case, the second space configured to be hermetically sealed from the first space;
a first conductive connecting member formed in the rear case, the first conductive connecting member comprising a first surface directed toward the front cover and a second surface directed toward the back cover;
an electrical connecting member comprising a first part disposed within the first space, a second part that extends to a second surface of a non-conductive structure, and a third part electrically contacting the first conductive connecting member; and
a printed circuit board disposed within the second space and electrically connected with the first conductive connecting member.

12. The electronic device of claim 11, wherein the first surface and the second surface of the first conductive connecting member are flat surfaces.

13. The electronic device of claim 12, wherein the electrical connecting member comprises one or more connection pads, and wherein the one or more connection pads and the first conductive connecting member are bonded to each other by ultrasonic welding.

14. The electronic device of claim 10, wherein the rear case comprises a sidewall having an opening configured to receive a side key disposed therein, the side key configured to be pressed into the opening of the sidewall in a lateral direction of the sidewall.

15. The electronic device of claim 14, wherein a first part of the rear case directed toward the sidewall comprises a conductive material, and a second part of the rear case disposed between the sidewall and the first conductive connecting member comprises a non-conductive material.

16. The electronic device of claim 15, wherein the non-conductive structure comprises a via-hole formed therein, and the first conductive connecting member is disposed within and fills the via-hole.

17. The electronic device of claim 10, wherein the first conductive connecting member is electrically connected to the printed circuit board by a second conductive connecting member.

18. The electronic device of claim 17, wherein the second conductive connecting member comprises a clip shape with resilience, the clip shape including a fixed end and a free end, the fixed end being secured to the printed circuit board, and the free end extending toward the first surface of the first conductive connecting member.

19. The electronic device of claim 17, wherein the electrical connecting member comprises a flexible material and the first conductive connecting member comprises a rigid material.

20. The electronic device of claim 10, wherein the front cover comprises at least one edge area having a curved surface.

* * * * *